United States Patent [19]

Ohmura et al.

[11] Patent Number: 5,086,280
[45] Date of Patent: Feb. 4, 1992

[54] CONTINUOUSLY VARIABLE PULSEWIDTH WAVEFORM FORMATION DEVICE EMPLOYING TWO MEMORIES

[75] Inventors: Ryuuji Ohmura; Naomi Higashino, both of Itami, Japan

[73] Assignee: Mitsubishi Denki Kabushiki Kaisha, Tokyo, Japan

[21] Appl. No.: 551,958

[22] Filed: Jul. 12, 1990

[30] Foreign Application Priority Data

Mar. 12, 1990 [JP] Japan .................................. 2-61573

[51] Int. Cl.[5] ........................ H03K 3/037; H03K 5/05
[52] U.S. Cl. ......................................... 328/61; 377/26; 307/265; 328/58; 328/63; 328/74
[58] Field of Search .................... 377/26; 328/64, 58, 328/63, 74; 307/268, 265

[56] References Cited

U.S. PATENT DOCUMENTS

| | | | |
|---|---|---|---|
| 3,621,403 | 11/1971 | Seiy | 328/61 |
| 4,330,751 | 5/1982 | Swain | 328/61 |
| 4,415,861 | 11/1983 | Palmquist et al. | 307/265 |
| 4,675,546 | 6/1987 | Shaw | 307/268 |

*Primary Examiner*—John S. Heyman
*Attorney, Agent, or Firm*—Oblon, Spivak, McClelland, Maier & Neustadt

[57] ABSTRACT

A waveform formation device according to the present invention comprises a memory storing rise time data and fall time data related to an output waveform, a first timing generator for producing a set signal at a timing related to the rise time data, and a second timing generator for producing a reset signal at a timing related to the fall time data. A flip flop circuit of the device produces an output signal which rises in response to the set signal and falls in response to the reset signal.

5 Claims, 5 Drawing Sheets

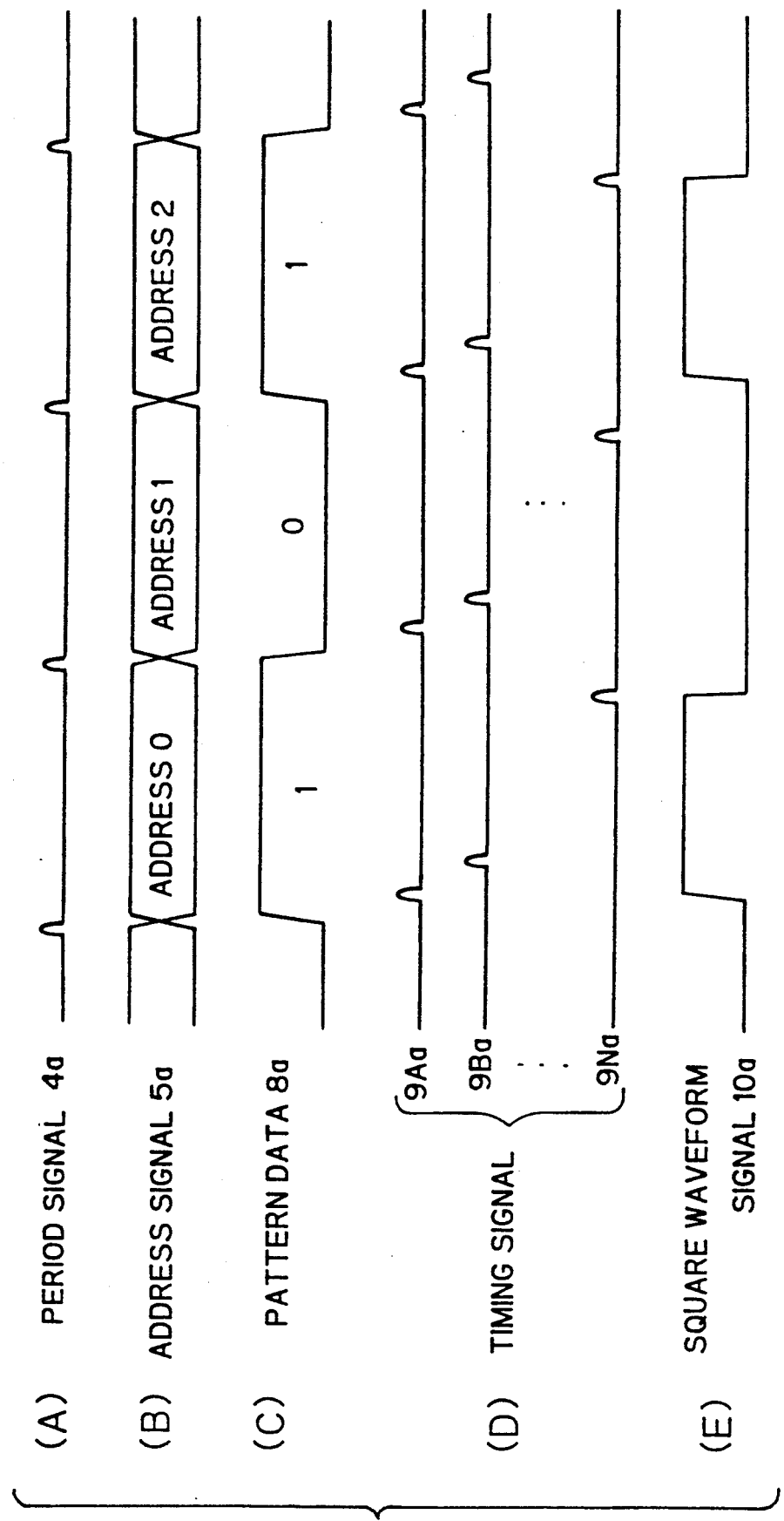

CONTINUOUSLY VARIABLE PULSEWIDTH WAVEFORM FORMATION DEVICE EMPLOYING TWO MEMORIES

BACKGROUND OF THE INVENTION

1. Field of the Invention

The present invention relates to a waveform formation device, and more particularly, it relates to a waveform formation device incorporated into an IC test device or the like for testing an integrated circuit for electrical characteristic, so as to form various square waveform signals.

2. Background Art

FIG. 4 is a schematic view showing a conventional waveform formation device incorporated into an LSI test device.

As shown in FIG. 4, the waveform formation device is provided with a controller 1 for controlling the entire device. A condition memory 2 is connected to the controller 1. The condition memory 2 stores various condition data required for determining test conditions, such as frequency specifying data, start address data, end adress data and switch data.

The waveform formation device is also provided with an oscillator 3 for generating a reference clock pulse 3a. A frequency divider 4 is connected to the oscillator 3. The frequency divider 4 latches frequency specifying data 1a. read from the condition memory 2 by the controller 1 and divides the clock pulse 3a outputted by the oscillator 3 to produce a period signal 4a of a frequency corresponding to the frequency specifying data 1a.

An address controller 5 generates an address signal 5a in synchronization with the period signal 4a applied by the frequency divider 4 to control a data reading operation of a pattern memory 8 discussed later. In this case, a start address in the data reading operation is determined based upon start address data 1b received from the condition memory 2 by the controller 1, while an end address is determined based upon end address data 1b applied similarly from the condition memory 2.

Thus, control means 6 is composed of the controller 1, the condition memory 2, the oscillator 3, the frequency divider 4 and the address controller 5, and the control means 6 controls waveform formation means 7 to a plurality of channels, respectively.

Each of the waveform formation means 7 to the channels includes a pattern memory 8, a plurality of timing generators 9A, 9B, ... , 9N, a formatter circuit 10 and a driver circuit 11.

The pattern memory 8 stores pattern data "1" or "0" corresponding to each address, and the formatter circuit 10 sequentially reads pattern data 8a of a corresponding address in accordance with the address signal 5a received from the address controller 5.

The timing generators 9A to 9N latch their respective timing data 1c received from the condition memory 2 through the controller 1 and generate timing signals 9Aa to 9Na at specified timings corresponding to the respective timing data 1c in synchronization with the period signal 4a of the frequency divider 4, respectively, so as to apply them to the formatter circuit 10. In this case, the timing generators 9A to 9N measure time, using the reference clock pulse 3a received from the oscillator 3, to determine respective timings.

The formatter circuit 10 produces a desired square waveform signal 10a based upon the pattern data 8a received from the pattern memory 8, the timing signals 9Aa to 9Na received from the timing generators 9A to 9N and switch data 1d received from the condition memory 2 through the controller 1 (this will be explained in detail hereinafter).

The level of the square waveform signal 10a is converted by the driver circuit 11, and thereafter it is applied to a device to be tested as a test signal 11a.

The operation of the waveform formation device incorporated into the LSI test device will now be described with reference to a timing chart shown in FIG. 5.

When the controller 1 receives test starting instructions from outside, various condition data required for determining conditions of the test, namely, the frequency specifying data 1a, the start address data 1b, the end address data 1b, the timing data 1c and the switch data 1d, are first read from the condition memory 2 and then transferred to the frequency divider 4, the address controller 5, the timing generators 9A to 9N and the formatter circuit 10, respectively.

Then, the oscillator 3 starts to apply the clock pulse 3a to the frequency divider 4. This causes the frequency divider 4 to start to divide the clock pulse 3a based upon the frequency specifying data 1a received from the condition memory 2, and thus the period signal 4a shown by (A) of FIG. 5 is produced. The period signal 4a is applied to the address controller 5 and the timing generators 9A to 9N to the channels.

When the address controller 5 receives the period signal 4a, the address signal 5a shown by (B) of FIG. 5 is produced, and the pattern memory 8 starts reading data with regard to each of the channels.

For instance, paying attention to the waveform formation means 7 to a first channel, as shown by (C) of FIG. 5, the pattern data 8a of "1" or "0" stored in a corresponding address is sequentially read from the pattern memory 8 based upon the address signal 5a and applied to the formatter circuit 10. An example in FIG. 5 presents a case in which the start address data 1b set in the address controller 5 is "0", where the pattern data 8a is sequentially read in order of address with a leading address of address "0". The reading operation is executed until it goes to an address corresponding to the end address data 1b.

Meanwhile, when the period signal 4a is applied to the timing generators 9A to 9N to the first channel, as shown by (D) of FIG. 5, in synchronization with the period signal 4a, the timing signal 9Aa to 9Na are produced at specified timings corresponding to the timing data 1c set in the timing generators 9A to 9N in advance, respectively, and then applied to the formatter circuit 10.

In the formatter circuit 10, the square waveform signal 10a is produced based upon the pattern data 8a received from the pattern memory 8, the timing signals 9Aa to 9Na received from the timing generators 9A to 9N and the switch data 1d received from the condition memory 2 in the manner discussed below. Based upon the switch data 1d, a timing signal for determining a timing of the rise and a timing signal for determining a timing of the fall are selected from the timing signals 9Aa to 9Na , respectively. For example, with an example of FIG. 5, the timing signal 9Aa is selected as the timing signal for determining a timing of the rise, while the timing signal 9Na is selected as the timing signal for determining a timing of the fall. As shown by (C) of FIG. 5, when "1" is applied as the pattern data 8a, as shown by (E) of FIG. 5, the square waveform signal 10a is produced which rises at the timing of the timing siganl 9Aa and falls at the timing of the timing signal 9Na. On the other hand, when "0" is applied as the pattern data 8a, the square waveform signal 10a is kept at a low level. In this way, the square waveform signal 10a having specified square waveforms is produced.

The level of the square waveform signal 10a is converted by the driver circuit 11 and it is applied to the device to be tested as the test signal 11a.

The above-mentioned operation has been discussed in conjution with the waveform formation means 7 to the first channel, but a similar operation is performed in the waveform formation means 7 to other channels; that is, the test siganls 11a having various square waveforms are produced based upon the pattern data 8a stored in the pattern memory 8 to the channels and the condition data 1c, 1d to the channels received from the condition memory 2, and then applied to the device to be tested.

In the conventional waveform formation device, for producing the test signals 11a, to the channels, it is required to set data while considering the mutual relations between the pattern data 8a and the condition data, such as the timing data 1c and the switch data 1d; there arises the problem that complicated data setting work is necessary. Such data setting work must be done whenever the test condition is changed, and it is very laborious work.

With the conventional waveform formation device, the timings of the rise and the fall of the square waveform signal 10a is uniformly determined based upon the switch data 1d and the timing data 1c, and during the test operation, the timing can not be freely changed. Hence, with the LSI test device provided with such a waveform formation device, a logical test in which simply high and low levels are required as the test signals 11a can be done without difficulty, but there arises the problem that an AC characteristic test in which the rise and fall timings of the test signal 11a must be varied as time elapses can not be done.

SUMMARY OF THE INVENTION

The present invention relates to a waveform formation device forming various square waveform signals.

The waveform formation device according to the present invention comprises a memory storing rise time data and fall time data related to an output waveform; control means for sequentially reading the rise time data and the fall time data in pairs from the memory in a specified cycle, a first timing generator for outputting a set signal at a timing related to the rise time data on the basis of the rise time data which is read from the memory by the control means; a second timing generator for outputting a reset signal at a timing related to the fall time data on the basis of the fall time data which is read from the memory by the control means; and a flip flop circuit for generating an output signal rising in response to the set signal and falling in response to the reset signal.

Accordingly, it is a general object of the present invention to provide a waveform formation device which can easily perform data setting work required for producing a specified square waveform signal.

It is another object of the present invention to provide a waveform formation device capable of producing a square waveform signal whose rise and fall timings vary as time elapses.

With the waveform formation device according to the present invention, in synchronization with the reading operation of the memory by the control means, the set signal is produced at the timing related to the rise time data by the first timing generator while the reset signal is produced at the timing related to the fall time data by the second timing generator. And by the flip flop circuit the output signal which rises in response to the set signal and falls in response to the reset signal is generated.

Thus, as the data setting work required for producing the specified square waveform signal, the rise time data and the fall time data may be merely stored in the memory. Moreover, adequately setting contents of the rise time data and the fall time data stored in the memory to each address, an arbitrary square waveform signal in which rising and falling timings vary as time elapses can be produced.

These and other objects, features, aspects and advantages of the present invention will become more apparent from the following detailed description of the present invention when taken in conjunction with the accompanying drawings.

BRIEF DESCRIPTION OF THE DRAWINGS

FIG. 5 is a timing chart for explaining the operation of the device of FIG. 4.

DETAILED DESCRIPTION OF THE PREFERRED EMBODIMENT

Figure 1:
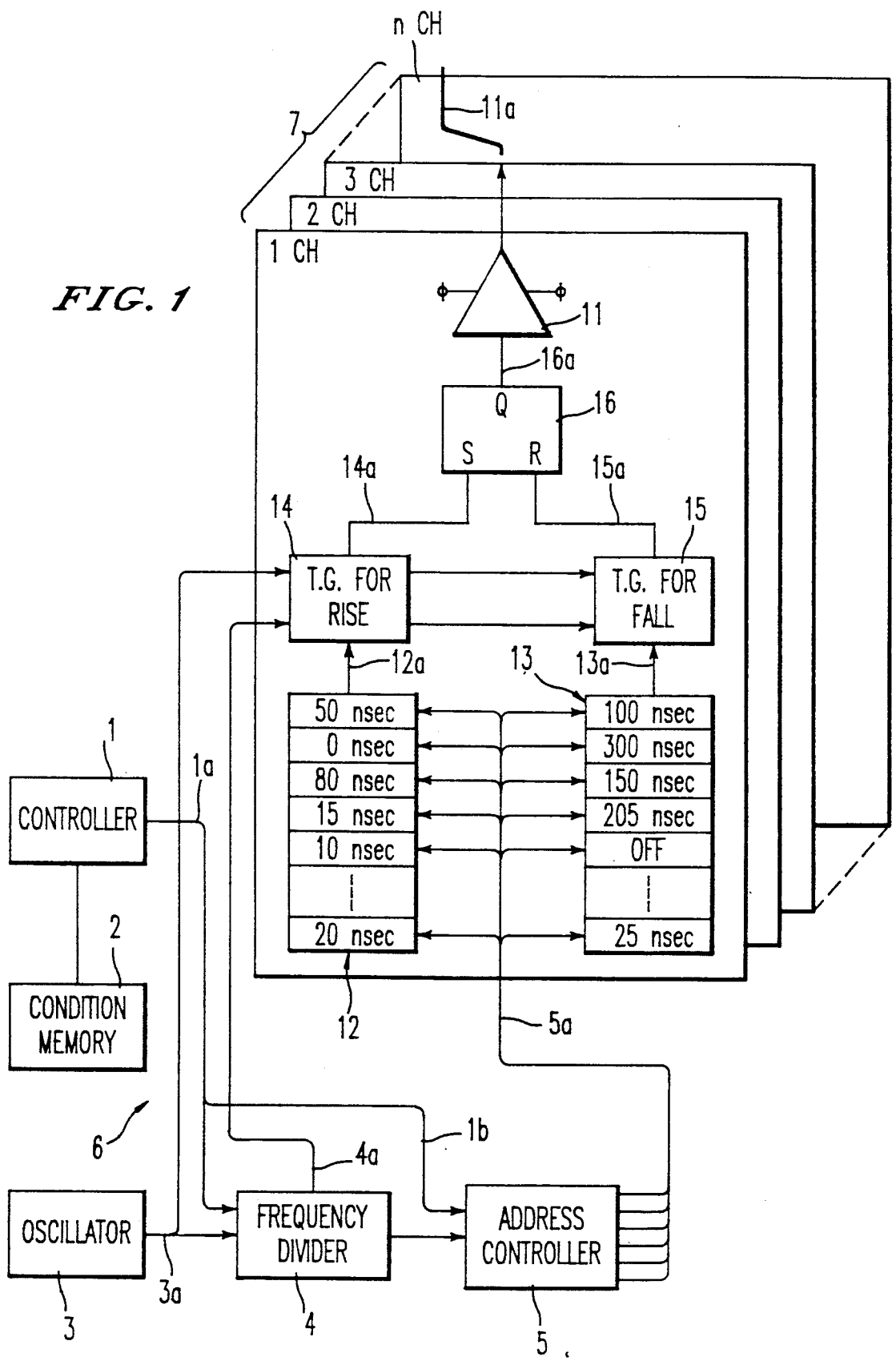
FIG. 1 is a schematic diagram showing an embodiment of a waveform formation device incorporated into an LSI test according to the present invention.

FIG. 1 is a schematic diagram showing an embodiment of a waveform formation device incorporated into an LSI test device according to the present invention.

As shown in FIG. 1, the waveform formation device is provided with control means 6 consisting of a controller 1, a condition memory 2, an oscillator 3, a frequency divider 4 and an address controller 5, similar to the prior art embodiment. The condition memory 2 stores various condition data required for determining test conditions, such as frequency specifying data 1a applied to the frequency divider 4, start address data 1b applied to the address controller 5 and end address data 1b. Other components in the control means 6 are the same as those of the prior art embodiment, and the control means 6 controls waveform formation means 7 to a plurality of channels, respectively.

Each of the waveform formation means 7 to the channels includes a memory 12 for rise, a memory 13 for fall, a rise timing generator 14, a fall timing generator 15, a flip flop circuit 16 and a driver circuit 11.

The memory 12 for rise stores rise time data related to a test signal waveform in order of address, while the memory 13 for fall stores fall time data related to the test signal waveform in order of address. The reading operations of the memories 12 and 13 are controlled based upon the address signal 5a received from the address controller 5, and read rise time and fall time data 12a and 13a are applied to the rise timing and fall timing generators 14 and 15, respectively.

The rise timing generator 14 outputs a set signal 14a based upon the rise time data 12a received from the memory 12 at a timing related to the rise time data 12a in synchronization with a period signal 4a received from the frequency divider 4. This type of rise timing generator 14 can be implemented, for example, in the following manner. The rise timing generator 14 is provided with a counter which is preset with a count value corresponding to the rise time data 12a in synchronization with the period signal 4a, and the counter counts based upon the clock pulse 3a outputted by the oscillator 3. After it counts as many times as the preset count value, the counter outputs the set signal 14a.

Similarly, the fall timing generator 15 outputs a reset signal 15a based upon the fall time data 13a received from the memory 13 at a timing related to the fall time data 13a in synchronization with the period signal 4a received from the frequency divider 4. The fall timing generator 15 is provided with a counter which is preset with a count value corresponding to the fall time data 13a in synchronization with the period signal 4a, and the counter counts based upon the clock pulse 3a outputted by the oscillator 3. After it counts as many times as the preset count value, the counter outputs the reset signal 15a.

The flip flop circuit 16 is, for example, an R-S flip flop circuit. The set signal 14a of the rise timing generator 14 is inputted to an S terminal of the flip flop circuit 16, while the reset signal 15a of the fall timing generator 15 is inputted to its R terminal. Thus, a square waveform signal 16a which rises in response to the set signal 14a and falls in response to the reset signal 15a is outputted from a Q terminal of the flip flop circuit 16.

The level of the square waveform signal 16a is converted by the driver circuit 11 and it is applied to the device to be tested as a test signal 11a.

The operation of the waveform formation device incorporated into the LSI test device will now be described with reference to the timing chart shown in FIG. 2.

When the controller 1 receives test starting instructions from outside, various condition data required for determining conditions of the test, namely, the frequency specifying data 1a, the start address data 1b, and the end address data 1b are first read from the condition memory 2 and then transferred to the frequency divider 4 and the address controller 5.

Figure 2:
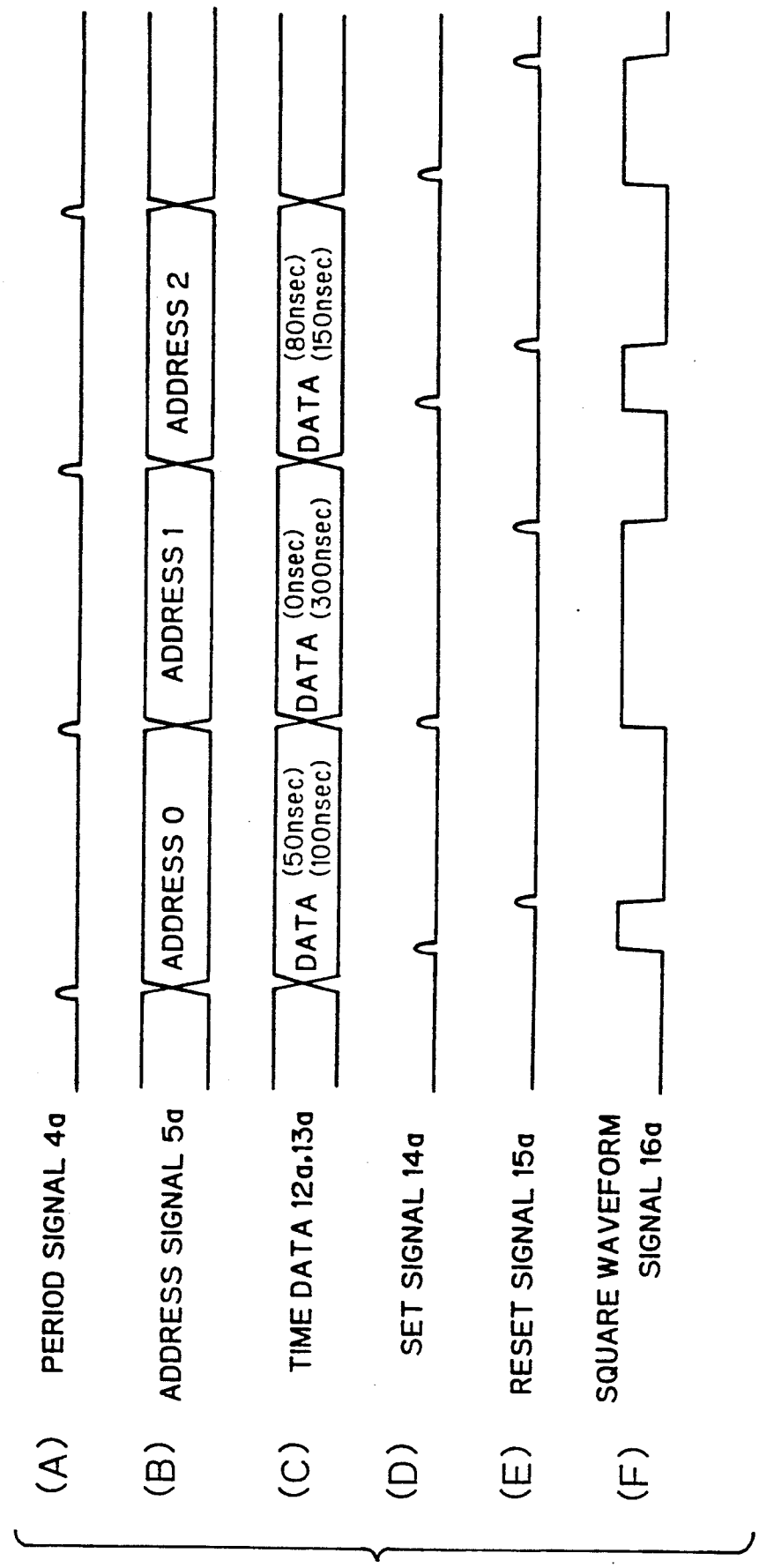
FIG. 2 is a timing chart for explaining the operation of the waveform formation device.

Then, the oscillator 3 starts, and similar to the prior art embodiment, the period signal 4a shown by (A) of FIG. 2 is produced by the frequency divider 4 and applied to the address controller 5 and the timing generators 14 and 15 to the channels.

When the period signal 4a is applied to the address controller 5, an address signal 5a shown by (B) of FIG. 2 is produced in synchronization with the period signal 4a, and the reading operation of the rise and fall memories 12, 13 starts.

For instance, paying attention to the waveform formation means 7 to a first channel, as shown by (C) of FIG. 2, the rise time data 12a and the fall time data 13a stored in a corresponding address are sequentially read in pairs from the memories 12 and 13 based upon the address signal 5a and are then applied to the rise timing generator 14 and the fall timing generator 15, respectively. An example in FIG. 2 shows a case in which the start address data 1b set in the address controller 5 is an address "0", where the rise time data 12a and the fall time data 13a are sequentially read in order of address with a leading address of the address "0". This reading operation is executed until it goes to an address corresponding to the end address data 1b.

Figure 4:
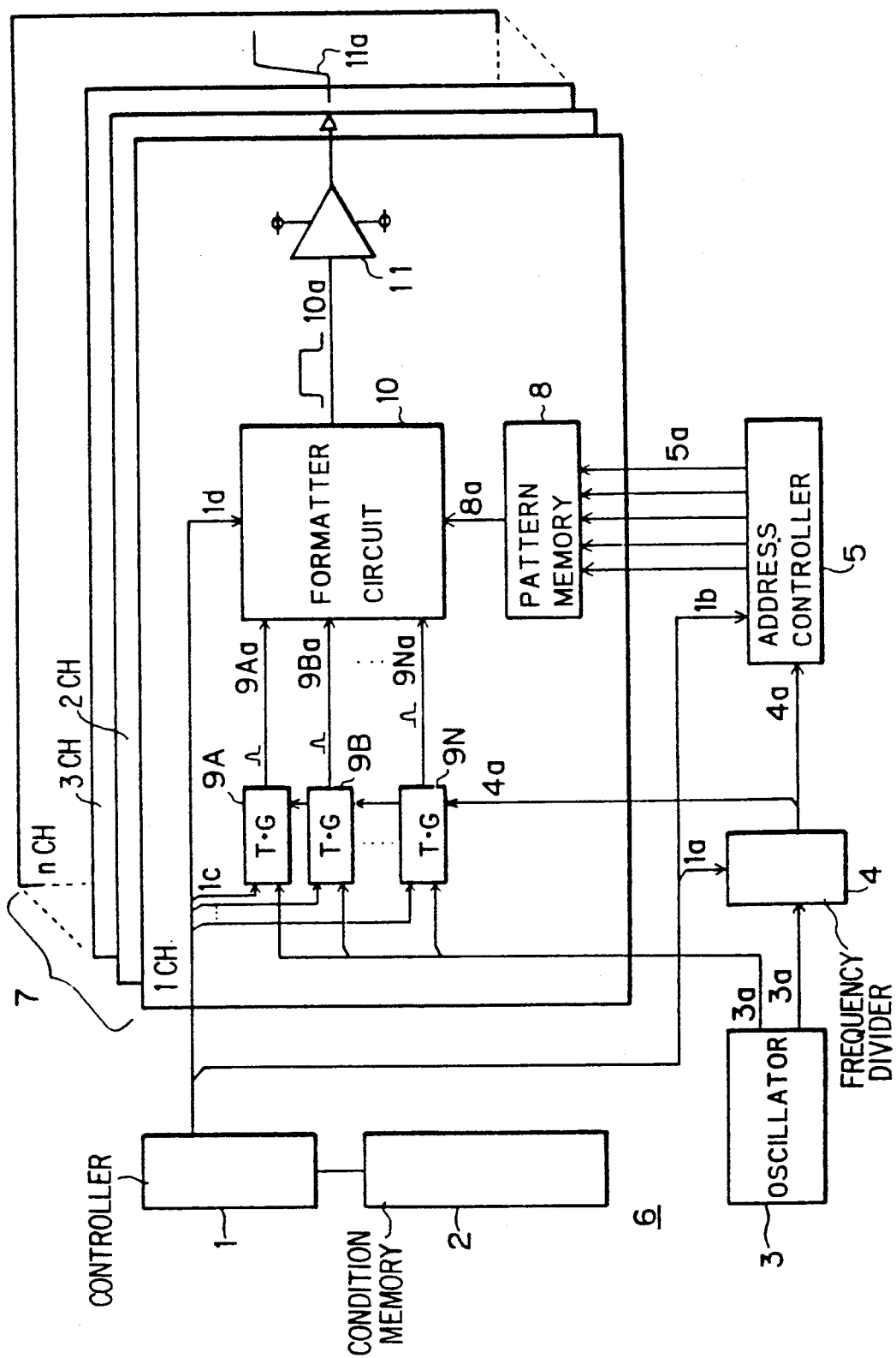
FIG. 4 is a schematic diagram showing a conventional waveform formation device incorporated into an LSI test device.

Meanwhile, when the period signal 4a is applied to the rise timing generator 14 and the fall timing generator 15, as shown by (D) and (E) of FIG. 4, in synchronization with the period signal 4a, the set signal 14a and the reset signal 15a are produced at timings related to the rise time data 12a and the fall time data 13a, and are applied to the S and the R terminal of the flip flop circuit 16. For example, when 50 nsec and 100 nsec are applied as the rise time data 12a and the fall time data 13a, respectively, the set signal 14a is outputted at 50 nsec after the period signal 4a is applied, while the reset signal 15a is outputted at 100 nsec after the period signal 4a is applied.

Thus, when the set signal 14a and the reset signal 15a are applied to the flip flop circuit 16, as shown by (F) of FIG. 2, the square waveform signal 16a which rises in response to the set signal 14a and falls in response to the reset signal 15a is produced in the flip flop circuit 16 and outputted from the Q terminal thereof.

The level of the square waveform signal 16a is converted by the driver circuit 11 and it is applied to the device to be tested as the test signal 11a.

The above-mentioned operation has been explained paying attention to the waveform formation means 7 to the first channel, but a similar operation is performed in the waveform formation means 7 to other channel. The test signals 11a having various square waveforms are produced based upon the rise time data 12a and the fall time data 13a stored in the memories 12 and 13 to the channels and then applied to the device to be tested.

With the waveform formation device, the timing of the rise and the fall of the test signal 11a is determined simply by the rise time data 12a and the fall time data 13a, whereby the data setting work can be simplified. In other words, data do not have to be set while considering the mutual relations between the pattern data 8a and the condition data such as the timing data 1c and the switch data 1d, unlike in the prior art embodiment, but the rise time data 12a and the fall time data 13a may be simply set.

As shown in FIG. 1, adequately setting the contents of the rise time and fall time data 12a and 13a stored in the memories 12 and 13 to each address, the arbitrary test signal 11a in which the rise and fall timings vary as time elapses can be produced. This allows a test signal for the so-called AC characteristic test to be produced. When 0 nsec is stored in an arbitrary address of the memory 12 while data OFF stopping the fall timing generator 15 is stored in the corresponding address of the memory 13, the test signal 11a becomes constant at a high level in a corresponding interval of the address. Furthermore, when 0 nsec is stored in an arbitrary address of the memory 13 while stop data OFF is stored in the corresponding address of the memory 12 similarly to the previous case, the test signal 11a becomes constant at a low level in a corresponding interval of the address. Thus, a test signal for the so-called logic test where simply a high level and a low level alone are required can also be produced.

The rise and fall time data 12a and 13a corresponding to various tests may be prepared in advance and stored in the memories 12 and 13, and a read area of the data may be selectively specified using the start address data 1b and the end address data 1b, whereby various test can be successively performed without change of data setting.

Figure 3:
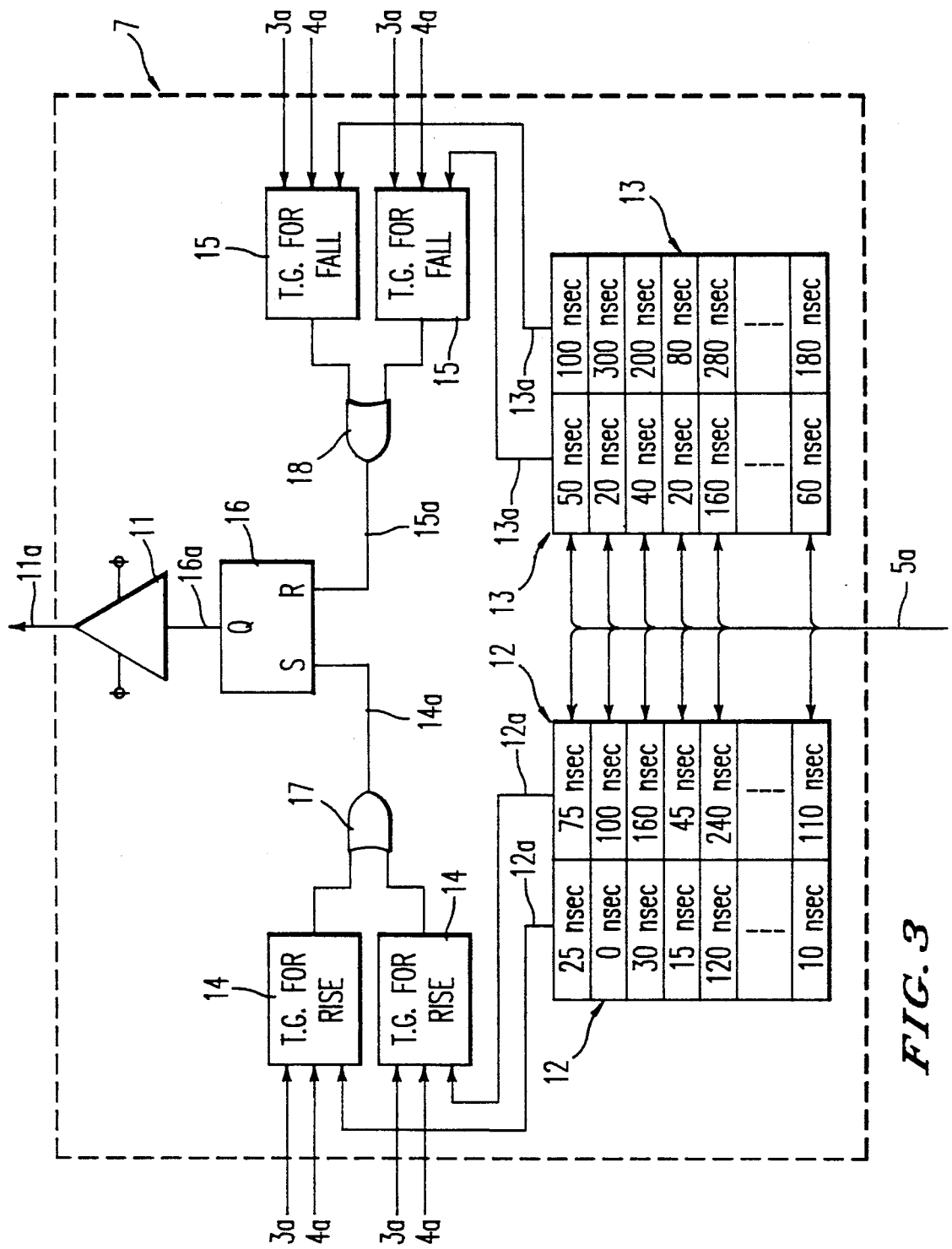
FIG. 3 is a diagram showing a variation of FIG. 1.

In the above embodiments, the waveform formation means 7 to the channels is provided with the memory 12 for the rise, the memory 13 for the fall, the rise timing generator 14 and the fall timing generator 15 one at a time, but as shown in FIG. 3, a plurality (e.g., two) of them may be provided at a time, respectively. In this case, the set signal 14a of each of the rise timing generators 14 and the reset signal 15a of each of the fall timing generators 15 are inputted to the flip flop 16 through OR-circuits 17 and 18, whereby a plurality of pulse waveforms can be made in a single cycle of the period signal 4a.

Furthermore, with the above-mentioned structure, a format of the rise time and fall time data 12a and 13a stored in the memories 12 and 13 and a format of data of simulation such as a CAD are in accord with each other, and hence the LSI test device and the CAD and the like can be easily linked for use.

Although the present invention has been described and illustrated in detail, it is clearly understood that the same is by way of illustration and example only and is not to be taken by way of limitation, the spirit and scope of the present invention being limited only by the terms of the appended claims.

What is claimed is:

1. A continuously variable pulse width waveform formation device, comprising:
   a first memory storing a plurality of rise time data related to an output waveform in order of address;
   a second memory storing a plurality of fall time data related to said output waveform in order of address;
   control means for sequentially reading said rise time data and said fall time data in pairs in order of address from said first and second memories in a specified cycle;
   a first timing generator for outputting a plurality of set signal pulses at a timing related to said rise time data on the basis of said rise time data which is read from said first memory by said control means;
   a second timing generator for outputting a plurality of reset signal pulses at a timing related to said fall time data on the basis of said fall time data which is read from said second memory by said control means; and
   a flip flop circuit for generating an output signal rising in response to said set signal pulses and falling in response to said reset signal pulses, whereby a continuously variable pulsewidth waveform is generated as a function of said data read from said first and second memories.

2. A device according to claim 1, wherein waveform formation means comprising said first and second memories, said first and second timing generators and said flip-flop circuit are provided to a plurality of channels, and said waveform formation means to the channels are controlled in synchronization with said control means.

3. A device according to either of claim 1 or 2, wherein said control means further comprises an oscillator producing a reference clock pulse, a frequency divider for producing a period signal of a specified frequency by dividing said clock pulse, and an address controller, in synchronization with said period signal, for producing an address signal for reading said rise time data and said fall time data in pairs, and applying said address signal to said first and second memories.

4. A device according to claim 3, wherein said control means further comprises a condition memory storing frequency specifying data, start address data and end address data, and a controller, in response to start instruction inputted from outside, for reading said frequency specifying data, said start address data and said end data from said condition memory and applying said frequency specifying data to said frequency divider while applying said start address data and said end address data to said address controller;
   said frequency divider producing a period signal of a corresponding frequency in accordance with said frequency specifying data;
   said address controller starting a reading operation of said memories from an address in accordance with said start address data and stopping the reading operation of said memories in an address in accordance with said end address data.

5. A device according to claim 3, wherein said first timing generator is provided with a first counter which is preset with a count value corresponding to said rise time data in synchronization with said period signal, said first counter outputting said set signal when a count operation corresponding to the preset count value has been executed based upon said clock pulse; and
   said second timing generator is provided with a second counter which is preset with a count value corresponding to said fall time data in synchronization with said period signal, said second counter outputting said reset signal when a count operation corresponding to the preset count value has been executed based upon said clock pulse.

* * * * *